US012802755B2

(12) United States Patent
Chinthu et al.

(10) Patent No.: US 12,802,755 B2
(45) Date of Patent: Nov. 17, 2026

(54) EXTERNAL PAD ISOLATION POWER SWITCH FOR RRAM SECURITY

(71) Applicant: GlobalFoundries U.S. Inc., Malta, NY (US)

(72) Inventors: Siva Kumar Chinthu, Bangalore (IN); Palle Sundar Veerendranath, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 150 days.

(21) Appl. No.: 19/007,918

(22) Filed: Jan. 2, 2025

(65) Prior Publication Data

US 2026/0188384 A1 Jul. 2, 2026

(51) Int. Cl.
*G11C 11/4074* (2006.01)
*G11C 13/00* (2006.01)

(52) U.S. Cl.
CPC ........ *G11C 13/0059* (2013.01); *G11C 13/003* (2013.01); *G11C 13/0038* (2013.01)

(58) Field of Classification Search
CPC .............. G11C 13/0059; G11C 13/003; G11C 13/0038
See application file for complete search history.

(56) References Cited

U.S. PATENT DOCUMENTS 5,818,783 A * 10/1998 Kim ....................... G11C 5/147 365/189.09
9,001,596 B2 4/2015 Park
9,780,674 B2 10/2017 Freeman et al.
9,940,029 B2 4/2018 Kimura et al.
2017/0038894 A1* 2/2017 Jeong .................... G06F 3/0412
2021/0104283 A1* 4/2021 Chyan ....................... G06F 1/26

FOREIGN PATENT DOCUMENTS

CN 107645157 B 4/2020

* cited by examiner

*Primary Examiner* — Min Huang
(74) *Attorney, Agent, or Firm* — David Cain; Hoffman Warnick LLC

(57) ABSTRACT

A pad isolation switch for a resistive random-access memory (RRAM) device. The switch includes: a first pair of transistors arranged in series between an external pad node and an internal node, the first pair of transistors coupled together with a connector node; a second pair of transistors arranged in series between a supply voltage and the connector node; a first high voltage selection circuit having a pair of inputs coupled to the external pad node and VDDW; and a first level shifter having an output coupled to a gate of the first transistor and an input coupled to an output of the first high voltage selection circuit.

20 Claims, 4 Drawing Sheets

| VPP/HV_VWR (EN = 0) | HV1/LS1 OUT | HV2/ LS2 OUT |
|---|---|---|
| VPP = 0/1.2/1.8/2.65/3.6<br>HV_VWR = 0/1.2/1.8/2.65/3.6 | HV1 = 1.8/1.8/1.8/2.65/3.6<br>LS1_Out = 1.8/1.8/1.8/2.65/3.6 | HV2 = 1.8/1.8/1.8/2.65/3.6<br>LS2_Out = 1.8/1.8/1.8/2.65/3.6 |

FIG. 2

| VPP (EN = 1) | HV1 / HV2 | LS1 OUT / LS2 OUT |
|---|---|---|
| 3.6 | 3.6 | 1.8 |
| 2.65 | 2.65 | 0.8 |
| 1.8 | 1.8 | 0 |
| 1.2 | 1.8 | 0 |

FIG. 3

| HV_VWR (EN = 0) | HV2 | LS2 OUT |
|---|---|---|
| 3.6 | 3.6 | 3.6 |
| 2.65 | 2.65 | 2.65 |
| 1.8 | 1.8 | 1.8 |
| 1.2 | 1.8 | 1.8 |

FIG. 4

EXTERNAL PAD ISOLATION POWER SWITCH FOR RRAM SECURITY

BACKGROUND

The present disclosure relates generally to resistive random-access memory (RRAM) devices, and more particularly to an external pad isolation pad isolation switch for RRAM security.

RRAM is an emerging technology for next generation non-volatile memory devices due to its enhanced properties such as fast operation speed, simple device structure, low power consumption, and good scalability potential. RRAM is a memory structure that includes an array of RRAM cells, each of which stores a bit of data using resistance values, rather than electronic charge. Particularly, each RRAM cell includes a resistive material layer, the resistance of which can be adjusted to represent logic "0" or logic "1."

RRAM cells operate under the principle that a dielectric, which is normally insulating, can be made to conduct through a filament or conduction path formed after the application of a forming voltage. The forming of a filament or conduction path is the forming process or forming mode of the RRAM. The forming process is a step in the creation of RRAM devices that involves applying a high voltage to create conducting paths in the switching layer, i.e., this process creates the filament that governs the switching process in RRAM. Applying the high voltage causes the RRAM to be switched to a low-resistive state, after which the RRAM is switched to a high-resistive state with a reset process.

After the forming process, one or more filament conductors are disposed across the resistive material layer. During a writing process, the filament conductors may be broken by applying a first writing voltage to the RRAM cell. After the filament conductors are broken, the resistance across the resistive material layer is at a high value, and a low current or no current may be passed. A subsequent writing process may apply a second writing voltage to reconnect the broken filament conductors. By changing the filament conductors, a high or low resistance is stored in the memory cell that does not change when the power is removed.

SUMMARY

All aspects, examples and features mentioned below can be combined in any technically possible way.

An aspect of the disclosure provides a pad isolation switch for a resistive random-access memory (RRAM) device. The switch includes: a first pair of transistors arranged in series between an external pad node and an internal node, the first pair of transistors coupled together with a connector node; a second pair of transistors arranged in series between a supply voltage and the connector node; a first high voltage selection circuit having a pair of inputs coupled to the external pad node and a supply voltage VDDW; and a first level shifter having an output coupled to a gate of the first transistor of the first pair of transistors and an input coupled to an output of the first high voltage selection circuit.

Another aspect of the disclosure provides a resistive random-access memory (RRAM) device. The device includes: an external pad node; an internal node; and a pad isolation switch coupled between external pad node and the internal node. The pad isolation switch includes: a first pair of transistors arranged in series between an external pad node and an internal node, the first pair of transistors coupled together with a connector node; a second pair of transistors arranged in series between a supply voltage and the connector node; a first high voltage selection circuit having a pair of inputs coupled to the external pad node and VDDW; and a first level shifter having an output coupled to a gate of a first transistor of the first paid of transistors and an input coupled to an output of the first high voltage selection circuit.

The switch of any of the above aspects may further include a second high voltage selection circuit having inputs coupled to the internal node and VDDW; and a second level shifter having an output coupled to a gate of a second transistor of the first pair of transistors and an input coupled to an output of the second high voltage selection circuit.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein:

FIG. 2 shows a table of voltage values present during a user mode of the RRAM device of FIG. 1, according to embodiments of the disclosure;

FIG. 3 shows a table of voltage values present during a forming mode of the RRAM device of FIG. 1, according to embodiments of the disclosure; and FIG. 4 shows a table of voltage values present during a measurement mode of the RRAM device of FIG. 1, according to embodiments of the disclosure.

Figure 1:
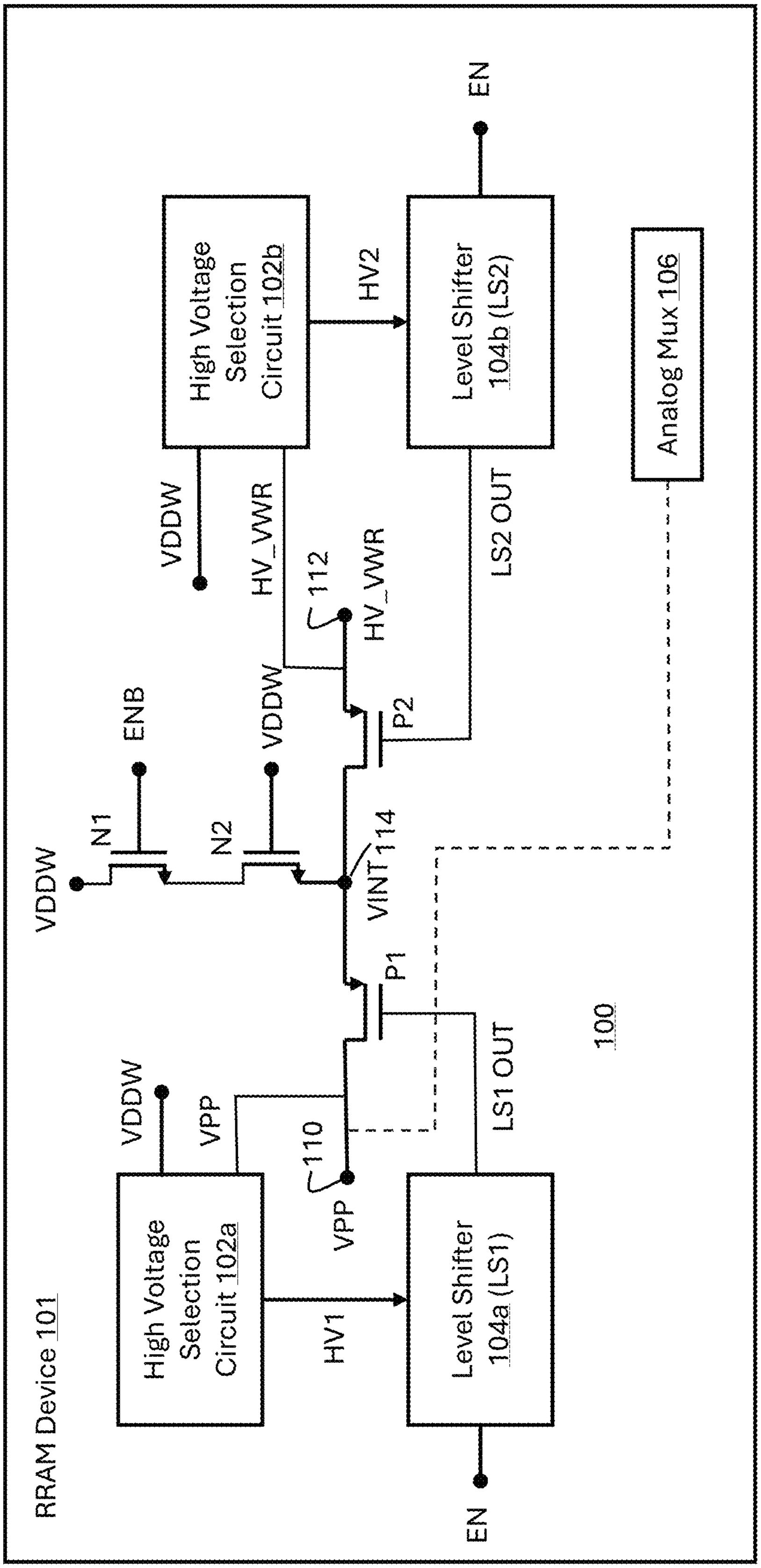
FIG. 1 shows an RRAM device with a pad isolation switch, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which are shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a circuit configured to isolate an external pad for security purposes in RRAM applications. RRAM devices generally require an external pad to perform the required forming operation. However, without some safeguard, a person could attempt to force some voltage or noise into the external pad, e.g., to breach the security of the device. The described circuit provided herein provides a pad isolation switch that prevents undesired security breaches after the forming mode.

FIG. 1 depicts an RRAM device 101 that includes a pad isolation switch 100 that isolates an external pad node 110. In this embodiment, external pad node 110 is utilized during the forming process to externally inject a high voltage. The pad isolation switch 100 resides between external pad node 110 and an internal node 112, and includes a pair of P-type transistors P1, P2 arranged in series, which are turned on (i.e., activated) during the forming process and turned off (i.e., deactivated) during the user mode. Internal node 112 is for example coupled to bit cells and an internal charge pump (not shown) to implement the high voltage forming operation. VPP represents a voltage being applied at external pad node 110, which could potentially comprise a forming voltage used during a forming mode, or a rogue voltage injected by a third-party during user mode attempting to breach security of the device. VPP can be mode-dependent and can vary, for example, from 0.0 volts (V) to 3.6V (e.g., 0V, 1.2V, 1.8V, 2.65V, or 3.6V) during a user mode, from 1.2V to 3.6V (e.g., 1.2V, 1.8V, 2.65V or 3.6V) during a forming mode, and from 0V to 1.8V (e.g., 0V, 0.6V, 1.2V, or 1.8V) during a measurement mode. HV_VWR represents a voltage signal appearing at internal node 112, e.g., either high voltage forming signals used during forming mode or read/write signals used during a user mode for read/write operations. HV_VWR can vary, for example, between 1.2V and 3.6V (e.g., 1.2V, 1.8V, 2.65V, or 3.6V) regardless of mode.

In this embodiment, P1 is gated by an output of level shifter 104*a* (LS1), which is controlled by an enable signal (EN) and which receives a voltage input HV1 from a high voltage selection circuit 102*a*. HV1 is the higher of the two voltage values appearing at the external pad node 110 (i.e., the source of P1) and VDDW, i.e., the highest of VPP and VDDW. Similarly, P2 is gated by an output of level shifter 104*b* (LS2), which is controlled by the same enable signal (EN) and receives a voltage input HV2 from a second high voltage selection circuit 102*a*. HV2 is the higher of the two voltage values appearing at the internal node 112 (i.e., the drain of P2) and VDDW, i.e., VDDW and HV_VWR. As discussed in greater detail below, due to the configurations of the high voltage selection circuits and level shifters, P1 and P2 will be in off-states (i.e., non-conductive) during a user mode and a measurement mode and in on-states (i.e., conductive) during a forming mode. Furthermore, the gate of N1 is connected to receive an inverted enable signal (ENB) and the gate of N2 is connected to receive VDDW. During a user mode or a measurement mode, P1 and P2 are in off-states (as discussed above) and EN is low (e.g., at 0.0V) and ENB is high (e.g., 1.8V) so VINT on connector node 114 is pulled to VDDW. However, in the forming mode, P1 and P2 are in on-states (as discussed above) and EN is high (e.g., at 1.8V) and ENB is low (e.g., at 0.0V), so N1 (which is controlled by ENB) is turned off, thereby disconnecting VDDW from connector node 114. In this case, because P1 and P2 are turned on, VPP equals VINT, which equals HV_VWR. N1 is gated by ENB (the inverse of EN) and N2 is gated by VDDW and accordingly is on when EN is 0 and off when EN is 1. EN is an enable signal that is set to 1 during forming mode and 0 during user mode. The second pair of transistors N1, N2 accordingly ensure that a floating connector node is avoided during the user and measurement modes, and also provide reliability of the device during the forming mode.

More specifically, switch 100 is configured to ensure that a rogue VPP cannot be utilized during the user mode to breach (i.e., hack) the device 101 by injecting signals to external pad node 110 that could potentially pass to internal node 112. During user mode, EN is disabled (i.e., set to 0) and ENB is enabled (i.e., set to 1), which will cause the internal voltage VINT at connector node 114 to be set to VDDW, i.e., 1.8 volts. By using two devices P1 and P2 in series with an internal voltage VINT of 1.8 volts when P1 and Pw are in an off-state, VPP can be at 0 volts and HV_VWR can be at 3.6 volts, providing an equal distribution and allowing the devices to operate in a safe operated area (SOA).

As mentioned above, first and second voltage selection circuits 102*a*-102*b* pass the highest of a pair of received input voltages (e.g., VPP or VDDW; and VDDW or HV_VWR) to first and second level shifters LS1-LS2, respectively. Additionally, LS1 and LS2 output corresponding level shifter output voltages LS1 OUT and LS2 OUT to gates of P1 and P2, respectively, depending upon the level of EN and on the received voltage. For example, each level shifter can be configured so that: (a) when EN is low (e.g., 0.0V), the level shifter output voltage will match the received voltage from the high voltage selection circuit; and (b) when EN is high (e.g., at 1.8V), the level shifter output voltage will vary as a function of the received voltage. For example, if EN is 1.8V, the level shifter output voltage could be as follows: 1.8V when the received voltage is 3.6V, 0.8V when the received voltage is 2.65V; and 0.0V when the received voltage is 1.8V or 1.2V.

Thus, in user mode, level shifter LS1 (enable input EN set to 0) will simply pass the highest value (HV1) of VPP and VDDW to the gate of P1, and level shifter LS2 will pass the highest value (HV2) of VDDW and HV_VWR to the gate of P2. This will ensure that no matter what voltage VPP is applied to pad node 110 (which may be unknown), P1 will turn off. FIG. 2 shows a table of values in the user mode. For example, if VPP is 0 volts or 1.2 volts, LS1 OUT will be 1.8 volts, which will turn off P1. If VPP is 2.65 volts or 3.6 volts, LS1 OUT will be 2.65 volts or 3.6 volts, respectively, which will also turn off P1. Similarly, if HV_VWR is 0 volts or 1.2 volts, LS2 OUT will be 1.8 volts, which will turn off P2. If HV_VWR is 2.65 volts or 3.6 volts, LS2 OUT will be 2.65 volts or 3.6 volts, respectively, which will also turn off P2. Accordingly, regardless of what voltage VPP is applied to external pad node 110 (and/or what voltage HV_VWR) is applied to internal node 112, P1 and P2 will always be turned off during user mode.

During forming mode, P1 and P2 remain turned on (i.e., activated), allowing the voltage VPP at node 110 to pass to node 112. During the forming mode, EN is enabled (i.e., set to 1) and ENB is disabled (i.e., set to 0), which turns off VDDW at connector node 114. Level shifters LS1 and LS2 provide the lowered output voltages, i.e., from 1.8 volts down to 0 volts depending on the VPP voltage. Level shifters are well understood electronic devices that change the voltage level of signals, and are not discussed in further detail herein. FIG. 3 shows a table of values in the forming mode. If VPP is 3.6 volts, then both HV1 and HV2 are at 3.6 volts and LS1 OUT and LS2 OUT are shifted down to 1.8 volts, which will activate P1 and P2, allowing VPP to pass to node 112. Similarly, if VPP is at 2.65 volts then both HV1 and HV2 are at 2.65 volts and LS1 OUT and LS2 OUT are shifted down to approximately 0.8 volts, which will also activate P1 and P2. Likewise, if VPP is at 1.8 volts or 1.2 volts, then both HV1 and HV2 are at 1.8 volts, respectively, and LS1 OUT and LS2 OUT are shifted down to 0.0 volts, which will also activate P1 and P2. Accordingly, during forming mode, P1 and P2 are always on regardless of the value of VPP.

Accordingly, both the first level shifter (LS1) and the second level shifter (LS2) include an enable input (EN) that is enabled during a forming mode of the RRAM device to pass a lower voltage to the gate of P1 and to the gate of P2 to ensure that P1 and P2 turn on. During user mode, the enable input (EN) is disabled and the first level shifter (LS1) passes HV1 (unchanged) to the gate of P1 and the second level shifter (LS2) passes HV2 to the gate of the P2.

Finally, switch 100 may also include an analog multiplexor (mux) 106 coupled to node 110 that can be used to introduce a voltage in a measurement mode to test the device 101 (prior to distribution). In measurement mode, EN is set to 0, which will drive the internal voltage VINT at connector node 114 to 1.8 volts. If, for example, analog mux 106 outputs values of 0, 0.6, 1.2 or 1.8 volts, LS1 OUT will be 1.8 volts and P1 will be turned off. Further, if HV-VWR voltage values of 1.2, 1.8, 2.65 or 3.6 are used as shown in FIG. 4, LS2 OUT will be 1.8, 1.8, 2.65 or 3.6 volts, respectively and P2 will be deactivated. This accordingly allows for unimpeded measurements during testing operations.

High voltage selection circuits 102*a* and 102*b* may be implemented by any circuit or system that compares two inputted voltages and outputs the larger voltage. An example selection circuit is described in U.S. patent application Ser. No. 18/542,900 filed on Dec. 18, 2023, the contents of which are hereby incorporated by reference.

Further, for purposes of illustration, the P-type transistors and N-type transistors are described herein and illustrated in the figures comprise metal oxide semiconductor field effect transistors (MOSFETs) and, particularly, P-type field effect transistors (PFETs) and N-type field effect transistors (NFETs), respectively. A MOSFET refers to a transistor with a semiconductor channel region positioned laterally between a source region and a drain region and with a gate (e.g., including a gate dielectric-gate conductor stack) adjacent to the channel region. However, it should be understood that the figures and discussion thereof are not intended to be limiting. For example, alternatively, a similar circuit structure could be formed using bipolar junction transistors (BJTs) and, particularly, PNP BJTs and NPN BJTs. The transistors may, for example, all have the same maximum voltage rating, and, for reduced power consumption, the maximum voltage rating can be relatively low as specified by the transistor data sheet. For example, the transistors can have a maximum voltage rating of 3.3V or lower. In some embodiments, the transistors can have a maximum voltage rating of 1.8V, 1.5V or 0.8V. To minimize manufacturing complexity, the transistors may also all be symmetric. That is, they can be designed so that the source region and the drain region are the same (e.g., same size, doping, etc.) except for minor process variations and so that the same maximum voltage rating applies to the gate to source voltage (VGS), the gate to drain voltage (VGD), and the source to drain voltage (VSD).

The terminology used herein is for the purpose of describing particular embodiments only and is not intended to be limiting of the disclosure. As used herein, reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed. It will be further understood that the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not. It will be further understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A pad isolation switch for a resistive random-access memory (RRAM) device, comprising:

a first pair of transistors arranged in series between an external pad node and an internal node, the first pair of transistors coupled together with a connector node;

a second pair of transistors arranged in series between a supply voltage and the connector node;

a first high voltage selection circuit having a pair of inputs coupled to the external pad node and a supply voltage (VDDW); and a first level shifter having an output coupled to a gate of a first transistor of the first pair of transistors and an input coupled to an output of the first high voltage selection circuit.

2. The pad isolation switch of claim 1, further comprising:

a second high voltage selection circuit having inputs coupled to the internal node and VDDW; and a second level shifter having an output coupled to a gate of a second transistor of the first pair of transistors and an input coupled to an output of the second high voltage selection circuit.

3. The pad isolation switch of claim 2, wherein:

the first high voltage selection circuit outputs a first highest voltage selected from one of the external pad node or VDDW; and the second high voltage selection circuit outputs a second highest voltage selected from one of the internal node or VDDW.

4. The pad isolation switch of claim 3, wherein both the first level shifter and the second level shifter include an enable input that is enabled during a forming mode of the RRAM device to output low voltages to the gates of the first transistor and the second transistor to turn on the first and second transistor.

5. The pad isolation switch of claim 4, wherein the enable input is disabled during a user mode of the RRAM device in which the first level shifter passes the first highest voltage to the gate of the first transistor and the second level shifter passes the second highest voltage to the gate of the second transistor.

6. The pad isolation switch of claim 5, wherein one transistor of the second pair of transistors has a gate coupled to an inverse enable input that allows the supply voltage to pass to the connector node in the user mode.

7. The pad isolation switch of claim 6, wherein the first transistor and second transistor of the first pair of transistors are turned off during the user mode.

8. The pad isolation switch of claim 1, wherein the first pair of transistors comprises P-type transistors and the second pair of transistors comprises N-type transistors.

9. The pad isolation switch of claim 1, wherein the external pad node is configured to receive a high voltage signal during a forming mode of the RRAM device.

10. The pad isolation switch of claim 9, wherein the internal node is coupled to cells of the RRAM device.

11. A resistive random-access memory (RRAM) device, comprising:

an external pad node;

an internal node; and a pad isolation switch coupled between external pad node and the internal node, the pad isolation switch comprising:

a first pair of transistors arranged in series between an external pad node and an internal node, the first pair of transistors coupled together with a connector node;

a second pair of transistors arranged in series between a supply voltage and the connector node;

a first high voltage selection circuit having a pair of inputs coupled to the external pad node and a supply voltage VDDW; and a first level shifter having an output coupled to a gate of a first transistor of the first pair of transistors and an input coupled to an output of the first high voltage selection circuit.

12. The RRAM device of claim 11, further comprising:

a second high voltage selection circuit having inputs coupled to the internal pad node and VDDW; and a second level shifter having an output coupled to a gate of a second transistor of the first pair of transistors and an input coupled to an output of the second high voltage selection circuit.

13. The RRAM device of claim 12, wherein:

the first high voltage selection circuit outputs a first highest voltage selected from one of the external pad node or VDDW; and the second high voltage selection circuit outputs a second highest voltage selected from the internal node and VDDW.

14. The RRAM device of claim 13, wherein both the first level shifter and the second level shifter include an enable input that is enabled during a forming mode of the RRAM device to output low voltages to the gates of the first transistor and the second transistor to turn on the first and second transistor.

15. The RRAM device of claim 14, wherein the enable input is disabled during a user mode of the RRAM device in which the first level shifter passes the first highest voltage to the gate of the first transistor and the second level shifter passes the second highest voltage to the gate of the second transistor.

16. The RRAM device of claim 15, wherein one transistor of the second pair of transistors has a gate coupled to an inverse enable input that allows the supply voltage to pass to the connector node in the user mode.

17. The RRAM device of claim 16, wherein the first transistor and second transistor of the first pair of transistors are turned off during the user mode.

18. The RRAM device of claim 11, wherein the first pair of transistors comprises P-type transistors and the second pair of transistors comprises N-type transistors.

19. The RRAM device of claim 11, wherein the external pad node is configured to receive a high voltage signal during a forming mode of the RRAM device.

20. The RRAM device of claim 19, wherein the internal node is coupled to cells of the RRAM device.

* * * * *